US011266029B2

(12) United States Patent
Kim

(10) Patent No.: US 11,266,029 B2
(45) Date of Patent: Mar. 1, 2022

(54) FOLDABLE DISPLAY DEVICE

(71) Applicant: LG Display Co., Ltd., Seoul (KR)

(72) Inventor: Jun-Hyung Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 38 days.

(21) Appl. No.: 16/691,442

(22) Filed: Nov. 21, 2019

(65) Prior Publication Data

US 2020/0170127 A1 May 28, 2020

(30) Foreign Application Priority Data

Nov. 23, 2018 (KR) .......................... 10-2018-0146819

(51) Int. Cl.
*H05K 5/00* (2006.01)
*H05K 5/02* (2006.01)
*G06F 1/16* (2006.01)

(52) U.S. Cl.
CPC ......... *H05K 5/0017* (2013.01); *H05K 5/0226* (2013.01); *G06F 1/1652* (2013.01); *G06F 1/1673* (2013.01)

(58) Field of Classification Search
CPC .. H05K 5/0017; H05K 5/0226; G06F 1/1652; G06F 1/1673; G06F 1/1681; G09F 9/301; H04M 1/0268; H04M 1/0214; H04M 1/0237
See application file for complete search history.

(56) References Cited

U.S. PATENT DOCUMENTS

| | | | | |
|---|---|---|---|---|
| 9,348,362 B2* | 5/2016 | Ko | .......................... | G06F 1/1626 |
| 9,460,644 B2* | 10/2016 | Namkung | .......... | G02F 1/133308 |
| 10,222,835 B2* | 3/2019 | Lim | ....................... | G06F 1/1652 |
| 10,297,785 B2* | 5/2019 | Ahn | ..................... | H01L 51/5237 |
| 10,426,051 B2* | 9/2019 | Brand | .................... | H05K 5/0226 |
| 10,433,438 B2* | 10/2019 | Moon | ................... | H05K 5/0086 |
| 10,509,441 B2* | 12/2019 | Wu | ........................ | G06F 1/1652 |
| 10,890,949 B2* | 1/2021 | Ou | .......................... | G06F 1/1624 |

(Continued)

FOREIGN PATENT DOCUMENTS

| | | |
|---|---|---|
| CN | 1690916 A | 11/2005 |
| CN | 102150126 A | 8/2011 |

(Continued)

*Primary Examiner* — James Wu
*Assistant Examiner* — Christopher L Augustin
(74) *Attorney, Agent, or Firm* — Seed IP Law Group LLP

(57) ABSTRACT

The present disclosure provides a folding display device including a flexible display panel; a first case positioned at a periphery of the display panel; a mid-frame positioned adjacent to the display panel and extending co-planar with the display panel; a plurality of holes extending through the mid-frame at a central region of the mid-frame; a second case positioned adjacent to the mid-frame extending co-planar with the mid-frame; and a third case positioned adjacent to the second case and configured to support the second case. The second case has a hinge part overlapping the plurality of holes in the mid-frame. The holes in the mid-frame and a connecting member holding the holes together in the mid-frame provides elasticity, expandability, and pliability to the folding display device. The connecting member also provides durability so that the folded portion endures the numerous folding and unfolding activities by a user of the display device.

20 Claims, 12 Drawing Sheets

(56) References Cited

U.S. PATENT DOCUMENTS

| | | |
|---|---|---|
| 2005/0236848 A1 | 10/2005 | Kim |
| 2013/0010405 A1 | 1/2013 | Rothkopf et al. |
| 2014/0157125 A1 | 6/2014 | Seo |
| 2015/0338888 A1* | 11/2015 | Kim .................... G06F 3/04886 345/156 |
| 2015/0373865 A1 | 12/2015 | Byeon |
| 2016/0011628 A1* | 1/2016 | Sato ...................... G06F 1/1626 361/679.3 |
| 2016/0111028 A1 | 4/2016 | Lee et al. |
| 2016/0127525 A1 | 5/2016 | Lee et al. |
| 2017/0010634 A1* | 1/2017 | Ahn .................... H04M 1/0216 |
| 2017/0061836 A1 | 3/2017 | Kim et al. |
| 2017/0139442 A1 | 5/2017 | Yoshizumi |
| 2018/0004252 A1 | 1/2018 | Ahrens et al. |
| 2018/0102072 A1* | 4/2018 | Lee ......................... G09F 9/301 |
| 2018/0110139 A1* | 4/2018 | Seo ..................... H04M 1/0216 |
| 2018/0198896 A1 | 7/2018 | Kang et al. |
| 2018/0213663 A1 | 7/2018 | Lin |
| 2018/0292860 A1 | 10/2018 | Siddiqui |
| 2018/0324356 A1 | 11/2018 | Sarraju et al. |
| 2018/0324964 A1* | 11/2018 | Yoo ....................... G06F 1/1681 |
| 2018/0329460 A1 | 11/2018 | Song |
| 2018/0341293 A1* | 11/2018 | Kim ....................... G06F 1/1675 |
| 2019/0036068 A1 | 1/2019 | Kim et al. |
| 2019/0082544 A1* | 3/2019 | Park .................... H05K 5/0226 |

FOREIGN PATENT DOCUMENTS

| | | |
|---|---|---|
| CN | 203176150 U | 9/2013 |
| CN | 104900149 A | 9/2015 |
| CN | 105551384 A | 5/2016 |
| CN | 106157819 A | 11/2016 |
| CN | 106205384 A | 12/2016 |
| CN | 106205385 A | 12/2016 |
| CN | 106255935 A | 12/2016 |
| CN | 107003789 A | 8/2017 |
| CN | 107272823 A | 10/2017 |
| CN | 107277197 A | 10/2017 |
| CN | 107395816 A | 11/2017 |
| CN | 107731100 A | 2/2018 |
| CN | 107770513 A | 3/2018 |
| CN | 108122492 A | 6/2018 |
| CN | 108268170 A | 7/2018 |
| JP | 2017-223946 A | 12/2017 |
| KR | 10-1834793 B1 | 3/2018 |
| KR | 10-2018-0094172 A | 8/2018 |
| TW | 201417068 | 5/2014 |
| TW | 201712651 | 4/2017 |
| WO | 2014/087951 A1 | 6/2014 |

\* cited by examiner

FOLDABLE DISPLAY DEVICE

CROSS-REFERENCE TO RELATED APPLICATION(S)

This application claims the benefit of Korean Patent Application No. 10-2018-0146819, filed Nov. 23, 2018, which is hereby incorporated by reference as if fully set forth herein.

BACKGROUND

Technical Field

The present disclosure relates to a foldable display device including a display panel that is capable of being folded or unfolded when being used.

Description of the Related Art

There are various kinds of display devices for displaying images, for example, liquid crystal display (LCD) devices, plasma display panel (PDP) devices, organic light-emitting diode (OLED) display devices, electrophoretic display (EPD) devices, etc.

Recently, studies on foldable display devices, which are bendable or foldable and may therefore be used in a greater variety of applications, have been actively conducted.

A foldable display device may be configured by connecting flat display panels together, or may be configured by simply using a display panel having flexibility (e.g., a flexible display panel).

The flexible display panel is capable of being bended, folded or rolled into various shapes due to its flexibility. A flexible display device including the flexible display panel incorporates a case for protecting the flexible display panel and various other components accommodated in the case. Thus, the flexible display device faces many problems that must be overcome in order to realize flexibility of displays by which the entire display device is capable of being changed to any desired shape.

On the other hand, a foldable display device may be configured to be folded and unfolded with a relatively simple mechanical structure.

The foldable display device includes a flexible display panel, a housing, and a hinge structure for allowing the flexible display panel to be maintained in a predetermined shape or at a predetermined folding angle.

The foldable display device is configured such that the flexible display panel is merely folded or unfolded at the hinge. However, because of these limiting features of the foldable display device in the related art, the foldable display device still has problems in terms of expandability of the display region, portability of the folded display panel and other technical problems known in the pertinent field.

BRIEF SUMMARY

The present disclosure provides a folding display device having a frame structure at the periphery of the foldable display panel. The frame structure having a flexible frame portion at a central region (e.g., folding region) of the frame structure allows the display panel to fold and unfold smoothly without showing any surface irregularities at the folding region. The frame structure is further supported with a mid-frame having holes. The mid-frame is further supported with an intermediate case having a plurality of hinge parts. Based on at least one of these structural features or based on the combination of these features, the folding display device enhances user experience by maximizing (by unfolding the display) or minimizing (by folding the display) the size of the device based on the user's needs. Further based on the various display modes (e.g., expand, dual, pivot mode), the user is able to view the display from various angles and directions. The various advantages of the folding display device according to the present disclosure will be detailed in the following descriptions.

One aspect of the present disclosure provides a folding display device including: a flexible display panel that is configured to be folded; a first case positioned at a periphery of the flexible display panel, the first case including a frame structure having a first frame member, a second frame member, and a third frame member; a mid-frame positioned adjacent to the flexible display panel; a plurality of holes extending through the mid-frame at a folding region of the mid-frame; a second case positioned adjacent to the mid-frame, the second case having a hinge part overlapping the plurality of holes in the mid-frame; and a third case positioned adjacent to the second case and configured to support the second case.

In one embodiment, the hinge part includes a plurality of unit hinges that are connected to each other, the plurality of unit hinges capable of being folded in sequences based on the configuration of the flexible display panel.

In one embodiment, the plurality of unit hinges is capable of forming a selected curvature based on the folded sequences.

In one embodiment, the first frame member and the second frame member each have a flexible frame member adjacent to the folding region of the first frame member and the second frame member, the flexible frame member capable of being folded based on the selected curvature of the plurality of unit hinges.

In one embodiment, the flexible frame member divides the flexible display panel to a first display region and a second display region.

In one embodiment, the flexible frame member overlaps with a location of the hinge part.

In one embodiment, the folding display device has one or more display modes including an expanded mode, a dual mode, and a pivot mode, wherein the expanded mode displays the flexible display panel at an unfolded state, wherein the dual mode displays the flexible display panel at a fully folded state, the fully folded state including a state where the first case and the second case are interlocked with each other, and wherein the pivot mode displays the flexible display panel at any folded state, the any folded state including any state between the unfolded state and the fully folded state.

In one embodiment, the expanded mode displays the first display region and the second display region as a combined single display.

In one embodiment, the dual mode displays first display information at the first display region and second display information at the second display region.

In one embodiment, the first display information and the second display information is a same data.

In one embodiment, the first display information and the second display information is a different data.

In one embodiment, the pivot mode includes an outer folding type and an inner folding type, wherein the outer folding type forms the selected curvature to have an obtuse angle; and wherein the inner folding type forms the selected curvature to have an acute angle.

In one embodiment, the frame structure further includes support members between the flexible frame member and the third frame member, wherein the support members overlap with the second display region.

In one embodiment, each of the support members is spaced apart from each other.

In one embodiment, the third case has fitting holes to fit the support members.

In one embodiment, the folding display device further includes: a tension spring on the flexible frame member; and a coupling member, the tension spring being coupled to a surface of the flexible frame member through the coupling member.

In one embodiment, the coupling member has a C-shaped cross section to cover a portion of the tension spring.

In one embodiment, the third case includes a holding groove.

In one embodiment, the frame structure further includes a hook frame member, the hook frame member being at each end of the first frame member and the second frame member.

In one embodiment, the first case includes a holding groove at the hook frame member.

In one embodiment, the holding groove interlocks the third frame member to the third case during the dual mode.

Another aspect of the present disclosure provides a folding display device including: a flexible display panel that is configured to be folded; a mid-frame positioned adjacent to a rear surface of the flexible display panel, the mid-frame having a plurality of holes extending through the mid-frame at a folding region; and a second case positioned adjacent to the mid-frame extending co-planar with the mid-frame, the second case having a hinge part overlapping the plurality of holes in the mid-frame.

In one embodiment, the folding display device has one or more display modes including an expanded mode, a dual mode, and a pivot mode.

In one embodiment, the expanded mode displays the flexible display panel at an unfolded state.

In one embodiment, the dual mode displays the flexible display panel at a fully folded state, the fully folded state including a state where the first case and the second case is interlocked with each other.

In one embodiment, the pivot mode displays the flexible display panel at any folded state, the any folded state including any state between the unfolded state and the fully folded state.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
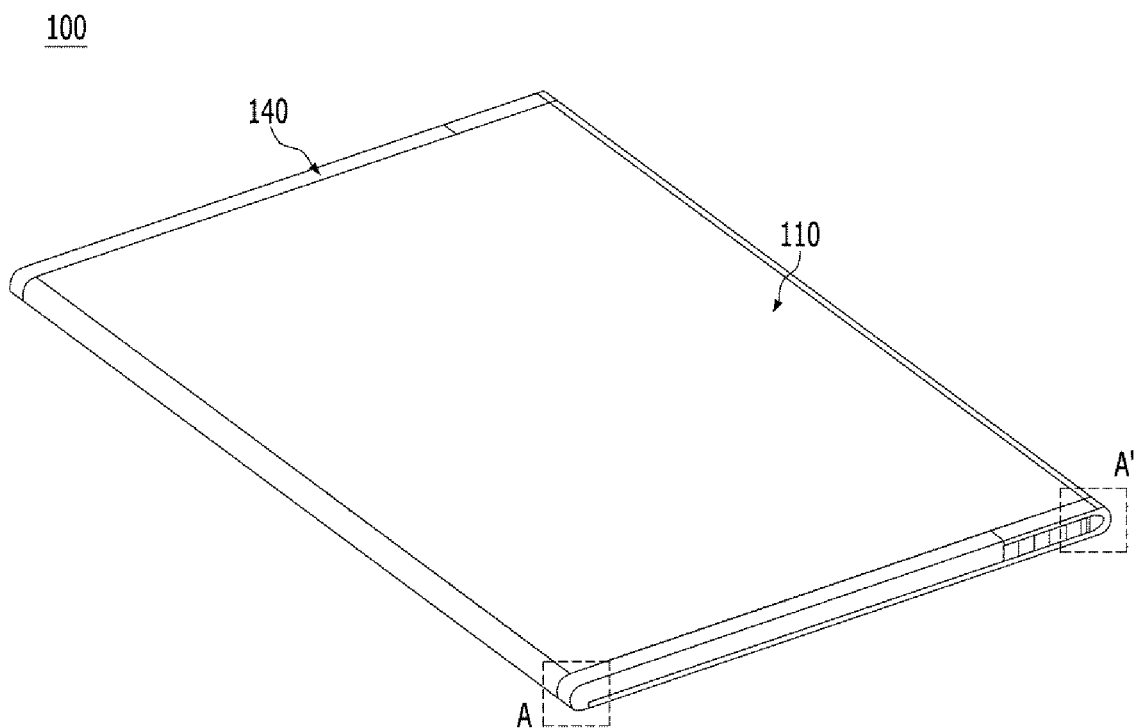
FIG. 1 is a perspective view illustrating a foldable display device according to an embodiment of the present disclosure, which is folded into a dual mode.

Reference will now be made in detail to the preferred embodiments of the present disclosure, examples of which are illustrated in the accompanying drawings. In the drawings, the same or similar elements are denoted by the same reference numerals even when they are depicted in different drawings. In the following description of the present disclosure, a detailed description of known functions or known configurations incorporated herein will be omitted when it may make the subject matter of the present disclosure rather unclear. Some features illustrated in the drawings are exaggerated, reduced or simplified for convenience in description and clarity, and the drawings and elements in the drawings are not always illustrated at the actual scale. However, these details will be easily understood by those skilled in the art.

Figure 2:
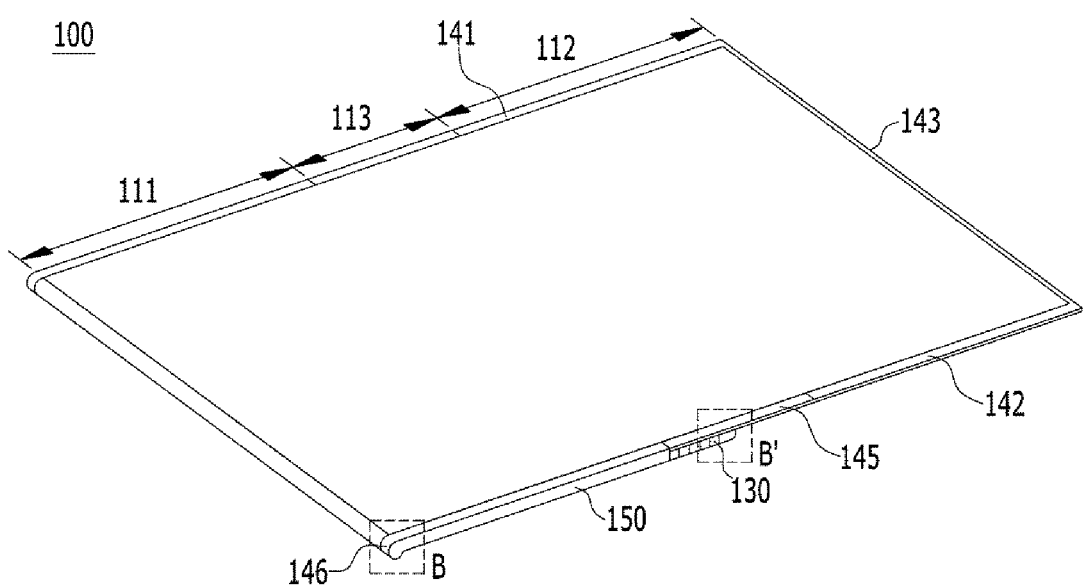
FIG. 2 is a perspective view illustrating a coupling structure of the foldable display device shown in FIG. 1, which is changed into an expanded mode.
Figure 3:
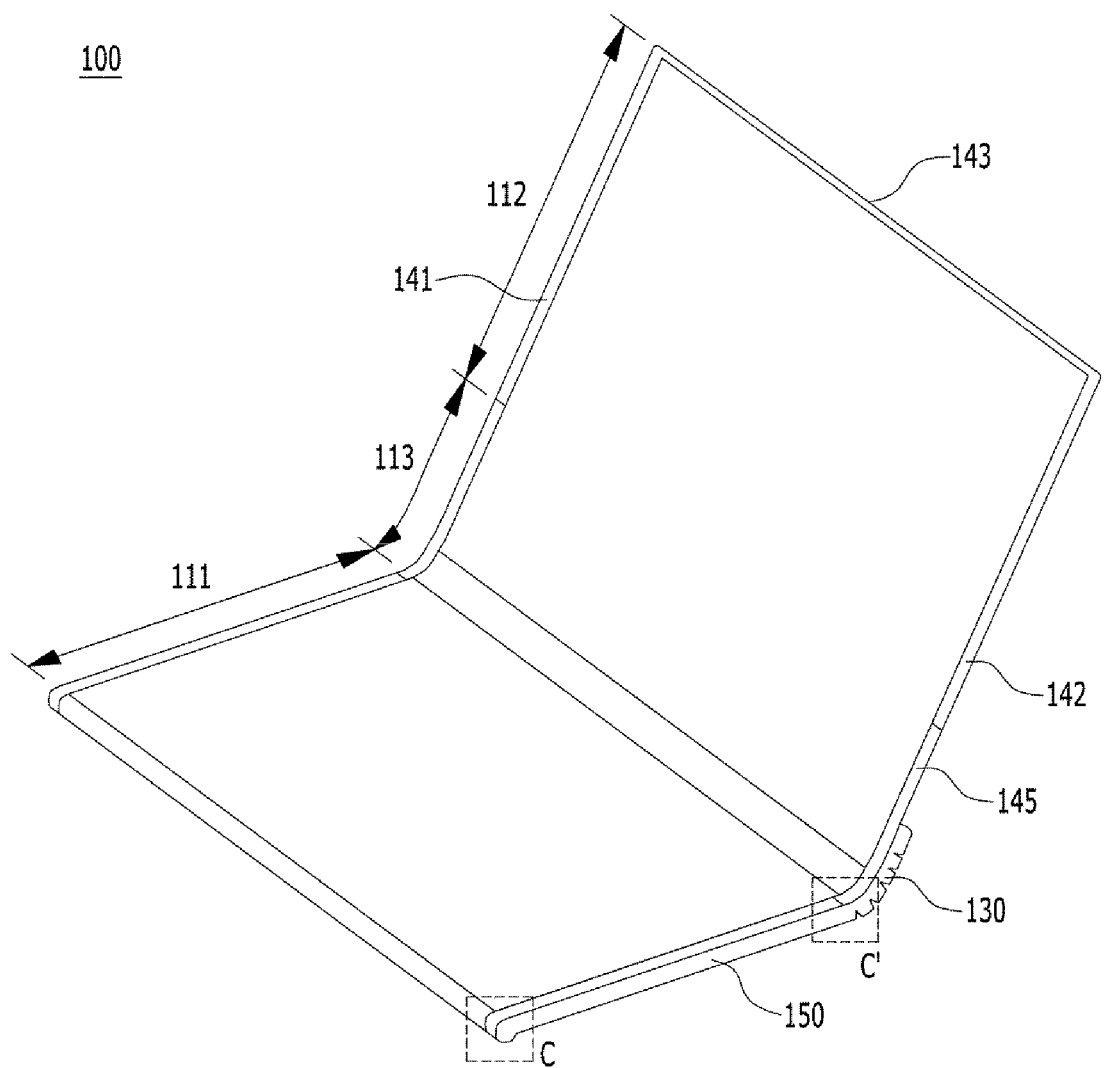
FIG. 3 is a perspective view illustrating the foldable display device shown in FIG. 1, which is folded into a pivot mode.

FIG. 1 is a perspective view illustrating a foldable display device according to an embodiment of the present disclosure, which is folded into a dual mode. FIG. 2 is a perspective view illustrating the foldable display device shown in FIG. 1, which is folded into an expanded mode. FIG. 3 is a perspective view illustrating the foldable display device shown in FIG. 1, which is folded into a pivot mode.

Referring to FIGS. 1 to 3, the foldable display device 100 according to one embodiment of the present disclosure includes a display panel 110 for displaying an image, a mid-frame 120 (shown in FIG. 4), which is coupled to the rear surface of the display panel 110, a hinge part 130 coupled to a folding region on the rear surface of the mid-frame 120, and an upper case 140 provided at the peripheral area of the upper surface of the display panel 110.

The display panel 110 is configured such that the entire display region is folded along a folding region and is divided into a first display region and a second display region. Upon an actual folding operation, because the display panel 110 is not sharply folded at a certain exact angle along the folding line, but is folded in stages or in sequence with a predetermined curvature by a hinge part 130, the folding region may be defined as a portion at which the hinge part 130 is positioned or the display panel 110 is bent into a curved shape. In other words, the display panel 110 may be maintained with specific bending shape and kept stable at that shape.

The display panel 110 may be implemented with a flexible display panel, which is made of a plastic material so as to be bent or folded, or may be implemented with a rigid flat display panel, which is not easily deformed by external force.

In the case in which the display panel 110 is implemented with a flexible display panel, flexible display panels such as an organic light-emitting diode (OLED) display panel, an electrophoretic display (EPD) panel, an electrochromic display (ECD) panel, or other suitable display panels may be used.

In the case in which the display panel 110 is implemented with a flat display panel, multiple flat display panels may be connected to each other in order to realize foldability. For example, two flat display panels having a flexible portion there between may be connected so that the two flat display panels can be physically folded relative to each other. In another example, a single flat display panel may be configured to include a flexible portion formed therein, by which the flat display panel can be folded. In one or more embodiments, a liquid crystal display (LCD) panel or a plasma display panel (PDP) may be used as the flat display panel. In other embodiments, other suitable flat display panel utilizing various light emitting sources can be used. In the case of a foldable display device in which multiple flat display panels are connected to each other so as to be physically folded relative to each other, each of the flat display panels may be connected with a corresponding circuit unit.

The display panel 110 includes an active area, in which an image is displayed, and a non-active area, which is located adjacent to the active area and in which no image is displayed. An extension line of a signal line, and a bonding region in which the extension line is connected to the circuit unit may be provided in the non-active area. The circuit unit serves to apply an electrical signal for driving the display panel. In one embodiment, the circuit unit can provide electrical signals to control the displays on the multiple flat display panels, perform various operations based on one or more display modes of the multiple flat display panels, and other suitable functions. In one embodiment, the circuit unit includes a substrate and an integrated circuit (IC) chip. A circuit pattern may be provided on the substrate and the IC chip may be mounted on the substrate. The substrate includes a main substrate, on which the IC chip is mounted, and a connection substrate, which connects the main substrate to the display panel. The main substrate may include a single-layered or multilayered wiring pattern. The main substrate may be configured as a rigid printed circuit board (PCB), which is not easily bent or folded, or may be configured as a flexible printed circuit board (FPCB), which has flexibility. The connection substrate may include a single-layered or multi-layered wiring pattern, and may be configured to be easily bent or folded. The connection substrate may be configured as a flexible printed circuit board (FPCB), or may be configured to have a chip-on-film (COF) structure.

The non-active area is located along the periphery of the display panel 110 (e.g., edges or lateral surfaces of the display panel 110), and the active area for displaying an image is located adjacent to the non-active area (e.g., areas inwards of the non-active area). The foldable display device 100 according to the embodiment of the present disclosure may be both of an outer folding type, in which the foldable display device is folded such that the folded active area halves are exposed to the outside and face away from each other, and of an inner folding type, in which the foldable display device is folded such that the folded active area halves directly face each other. The display panel 110 according to the embodiment of the present disclosure may further be provided on the upper surface thereof with a protective film for protecting the upper surface or various optical sheets. The protective film or the optical sheet may be configured so as to include a base film and barrier coating applied to opposite sides of the base film. The base film may be embodied by various resins such as PI (polyimide), PC (polycarbonate), PET (Polyethylene terephtalate), PES (Polyethersulfone), PEN (Polyethylene naphthalate), FRP (Fiber Reinforced Plastic) or the like. The barrier coating may be applied to the surfaces of the base film that face each other, and may be prepared by organic film or inorganic film in order to maintain flexibility.

The foldable display device 100 according to the embodiment of the present disclosure may include a first display region 111, a second display region 112 and a folding region 113. The first display region 111 and the second display region 112 are relatively folded with respect to each other about the folding region 113. The foldable display device 100 may be converted into one of a dual mode (e.g., double-sided mode) in which the first display region 111 and the second display region 112 face away from each other in opposite directions as illustrated in FIG. 1; an expanded mode in which the first display region 111 and the second display region 112 are disposed in the same plane as illustrated in FIG. 2; and a pivot mode in which the first display region 111 and the second display region 112 are partially folded relative to each other at any suitable angle as illustrated in FIG. 3. For example, in the pivot mode, the upper surfaces of the first display region 111 and the second display region 112 may be folded at an acute angle or a blunt angle or at a right angle. In further embodiments, the pivot mode can have various predetermined or selected angles so that a user can have various set angles suitable for a better viewing experience. For example, the user can set the angle between the first display region 111 and the second display region 112 at 110 degrees so that the foldable display device 100 sits stable on its own as shown in FIG. 3. Here, the user may display a virtual keyboard on the first display region 111 and activate the second display region 112 for regular display and use the foldable display device 100 as if it were a notebook computer having a key board or a handheld mobile device having a key board display.

Figure 4:
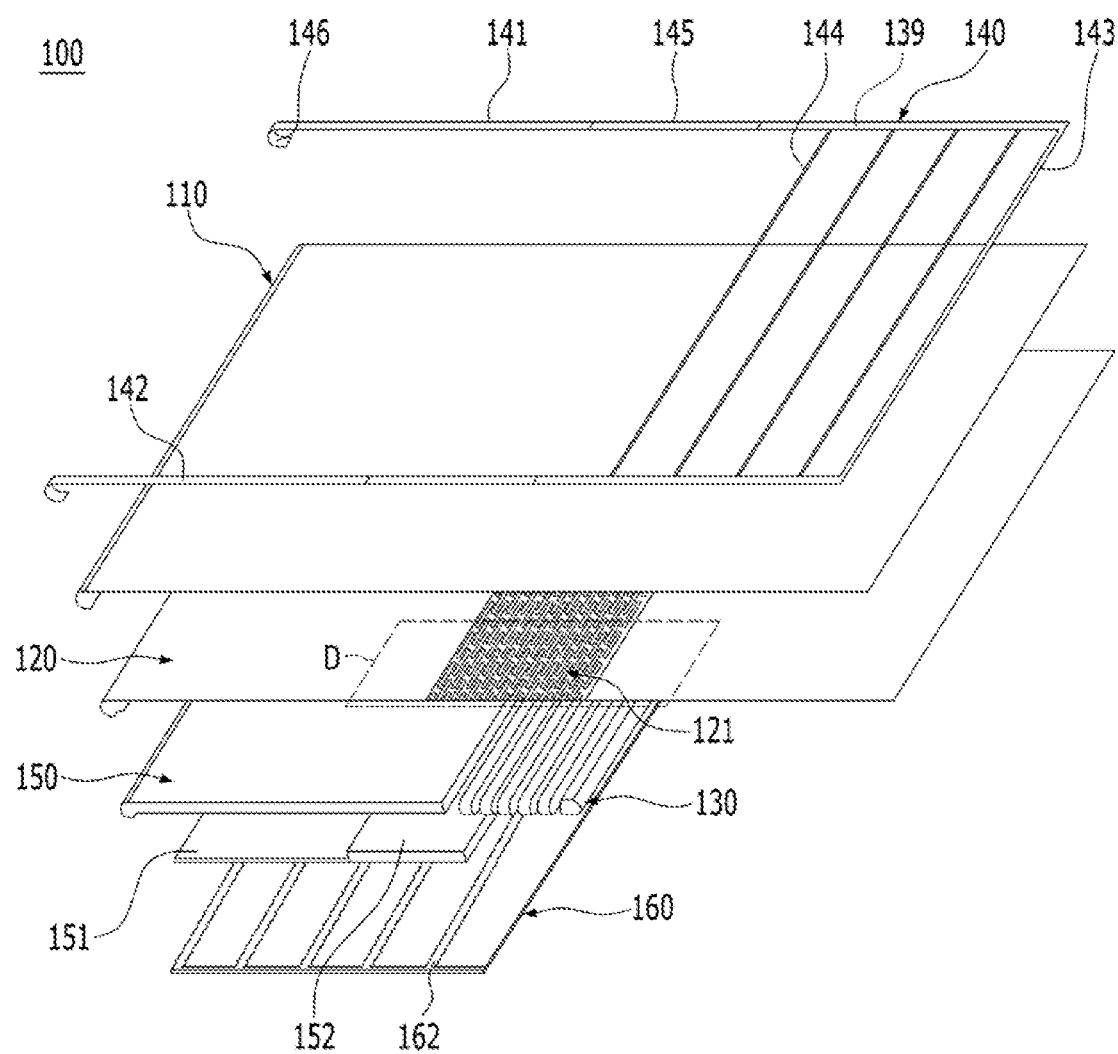
FIG. 4 is an exploded perspective view of the foldable display device shown in FIG. 2, in which the internal components are separated from each other.
Figure 5:
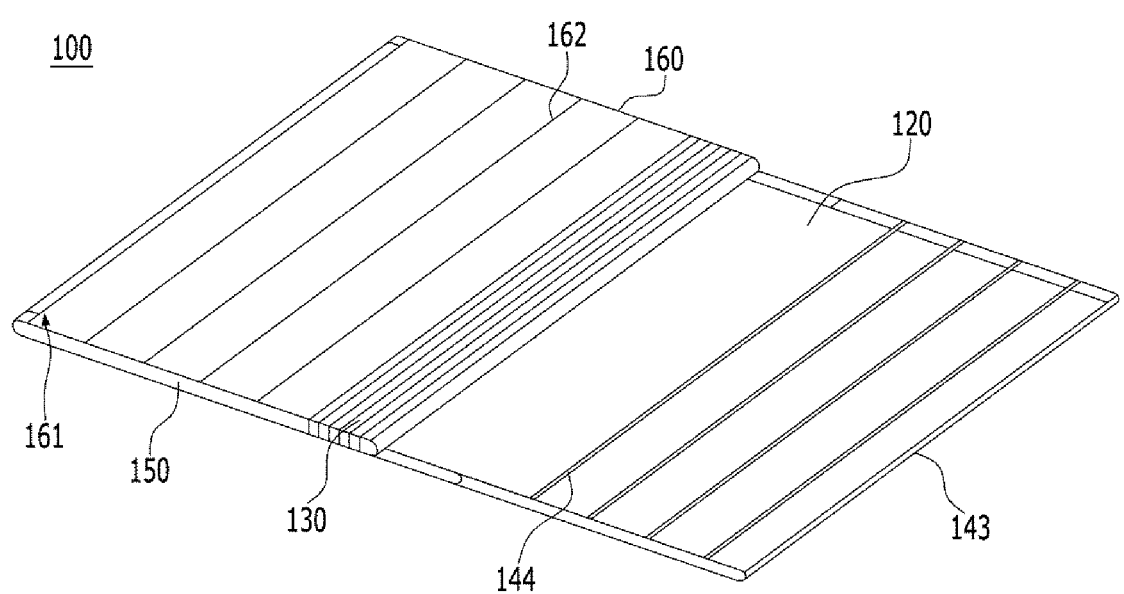
FIG. 5 is a perspective view illustrating the foldable display device shown in FIG. 2 when viewed in the direction of the rear surface.

FIG. 4 is an exploded perspective view of the foldable display device shown in FIG. 2, in which the internal components are separated from each other. FIG. 5 is a perspective view illustrating the foldable display device shown in FIG. 2 when viewed in the direction of the rear surface.

Referring to FIGS. 4 and 5, the foldable display device 100 according to the embodiment of the present disclosure includes the display panel 110, the mid-frame 120, the hinge part 130, the upper case 140, an intermediate case 150 and a lower case 160.

The mid-frame 120 is coupled to the rear surface of the display panel 110 so as to support the rear surface of the display panel 110. The portions of the mid-frame 120 that correspond to the first display region 111 and the second display region 112 are made of a thin flat metal plate so as to prevent the first display region 111 and the second display region 112 from being bent. The portion of the mid-frame 120 that correspond to the folding region 113 between the first display region 111 and the second display region 112 has a plurality of holes 121, and is folded together with the display panel 110 when the display panel 110 is folded. The holes 121 are apertures extending through the mid-frame 120. The holes 121 can be formed by any acceptable method including punching the mid-frame 120 with a tool to create punched holes; laser cutting; etching, such as chemical etching with a mask; cutting with a blade, creating the holes using a mold or other pattern when the mid-frame 120 is made; or any other acceptable technique.

The hinge part 130 is composed of plural hinges or links which are connected to each other and are bent with a predetermined curvature in stages or in sequence so as to allow the folding region 113 to be folded. The hinge part 130 may, of course, be composed of a plurality of hinge parts. When the hinge part 130 is composed of a plurality of hinge parts, the display region may be divided into three or more display regions by the plurality of folding regions 113. Furthermore, when the plurality of folding regions 113 are provided, the folding regions 113 may be folded in directions different from each other. The components of each of the hinge parts 130 (e.g., unit hinges or link segments) are rotated relative to each other at the folding region 113. At this time, as the hinge part 130 is folded, the display panel 110 is pressed and folded with a predetermined curvature.

The upper case is coupled to the upper surface of the display panel 110 so as to connect the peripheral areas of the first display region 111 and the second display region 112 to each other.

The upper case 140 includes a top frame 139 (also referred to as a frame structure) having a first frame member 141, which is provided at peripheral areas of the first display region 111 and the second display region 112 which are connected to each other; a second frame member 142, which is provided at the opposite peripheral areas of the first display region 111 and the second display region 112 which are connected to each other; a third frame member 143 connecting one end of the first frame member 141 to one end of the second frame member 142; a plurality of support members 144, which are provided at the second display region 112 so as to connect the first frame member 141 to the second frame member 142; flexible frame members 145, which are provided at the first frame member 141 and the second frame member 142 so as to be positioned at the folding region 113; and tension springs 147, each of which is coupled to the rear surface of a corresponding one of the flexible frame members 145. In one or more embodiments, the top frame 139 is a single frame structure having frame members on three sides. In other embodiments, the top frame 139 can be an assembly of multiple frame members (e.g., the first frame member 141, the second frame member, 142, the third frame member 143, the flexible frame members 145). In one or more embodiments, the frame structure may be made of metal (e.g., aluminum), stainless steel, and any other suitable materials capable of supporting the display panel during the folding operation as well as having durability from multiple folding operations.

As illustrated in FIG. 4, the first frame member 141 and the second frame member 142 are disposed so as to connect upper lateral sides and lower lateral sides of the first display region 111 and the second display region 112 to each other. The third frame member 143 is provided at the first ends of the first frame member 141 and the second frame member 142, and is selectively coupled to the lower case 160 to be described later depending on a folding mode.

The first frame member 141 and the second frame member 142 are disposed on the peripheral areas of the upper surfaces of the display panel 110 so as to be exposed. The display panel 110 may be provided the peripheral areas thereof with stepped portions such that the first frame member 141 and the second frame member 142 do not project from the upper surface of the display panel 110. Here, the third frame member 143 and the support members 144 are coupled to the rear surfaces of the first frame member 141 and the second frame member 142, and are disposed on the rear surface or the lateral surface of the display panel 110 or the mid-frame 120. The third frame member 143 may include therein the support members 144 for providing elastic restoring force.

The support members 144 support the rear surface of the second display region 112 of the display panel 110 in conjunction with the mid-frame 120. Here, the mid-frame 120 is attached to the rear surface of the display panel 110 so as to prevent bending of the display panel 110 attributable to the flexibility of the display panel 110. The support members 144 are disposed on the rear surface of the mid-frame 120 or between the display panel 110 and the mid-frame 120 so as to provide elastic force which enables the second display region 112 and the mid-frame 120 to be restored to the normal position when they are pressed by external force. In one embodiment, the support members 144 may be implemented with rubber bands or fibers having elasticity or a tension spring. Accordingly, the support members 144 may be disposed on the rear surface of the second display region 112 or the mid-frame 120 of the display panel 110 so as to elastically connect the rear surfaces of the first frame member 141 and the second frame member 142 to each other.

The flexible frame members 145 are positioned at the centers of the first frame member 141 and the second frame member 142. The positions of the flexible frame members 145 may be changed depending on the position of the folding region 113.

The second ends of the first frame member 141 and the second frame member 142 are provided with hook frame members 146. The hook frame members 146 may be implemented with a curved display (e.g., edge display) in which the second ends of the first frame member 141 and the second frame member 142 are curved or bent toward the display panel 110 and thus the display panel 110 and the mid-frame 120 are also bent along the inner curved surface of the hook frame member 146. In one embodiment, the edge display exhibits display information (e.g., images, videos, user interface related information or the like) on the hook-shaped or C-shaped portion of the hook frame member 146. The portion of the mid-frame 120 that is folded and unfolded based on the various modes (e.g., dual mode, expanded mode, pivot mode) may be provided with, for example, holes 121 to provide flexibility and expandability. In other embodiments, different structures capable of providing flexibility, expandability, elasticity can be used in lieu of holes for the curved portion of the mid-frame 120. For example, a rubber member, pliant polymer, or other member that is pliable and durable. The intermediate case 150 is coupled to the rear surface of the mid-frame 120. The intermediate case 150 receives therein a control module 151 such as a circuit board for controlling operation of the display panel 110 or a battery 152, and the hinge part 130 is coupled to one lateral surfaces of the intermediate case 150. Consequently, the hinge part 130 and the intermediate case 150 may have the same length/height. The other lateral surface of the intermediate case 150 is curved along the curved surfaces of the hook frame members 146 so as to be surrounded by the display panel 110 and the mid-frame 120. Accordingly, in one embodiment, the intermediate case 150 functions to support the interior of the display panel 110, which is implemented as the edge display.

The lower case 160 is provided on the rear surface of the intermediated case 150. The lower case 160 covers the portions of the display panel 110 and the mid-frame 120 that surround the other lateral surface of the intermediate case 150 and also covers the rear surface of the intermediate case 150. The lower case 160 has a holding groove 161, which enables the second display region 112 to be held on the outer surface of the lower case 160 when the display panel 110 is folded into the dual mode. In other embodiments, the holding groove 161 can be located at the hook frame member 146 along the curved surface of the hook frame member 146. Furthermore, the outer surface of the lower case 160 is provided with fitting holes 162 into which the plurality of support members 144 disposed on the rear surface of the mid-frame 120 is fitted. Accordingly, even when the second display region 112 is folded toward the outer surface of the lower case 160 so as to function in the dual mode, there is an effect of being capable of holding the second display region 112 in a flat plate state without interference with the third frame member 143 or the support members 144.

Figure 6A:
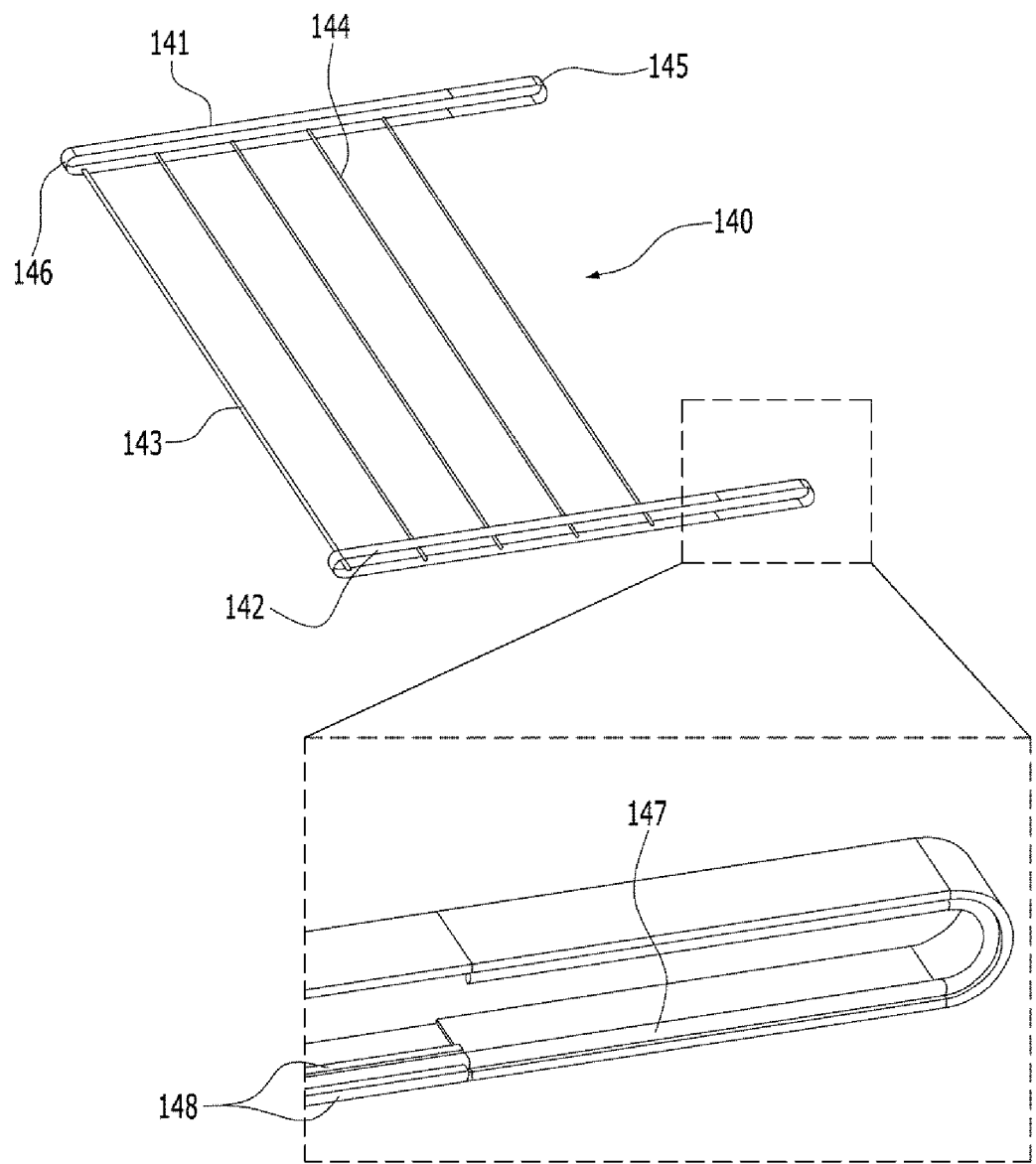
FIG. 6A is a perspective view illustrating an upper case of the foldable display device shown in FIG. 4, which is folded into the dual mode and a portion of which is illustrated in an enlarged view.
Figure 6B:
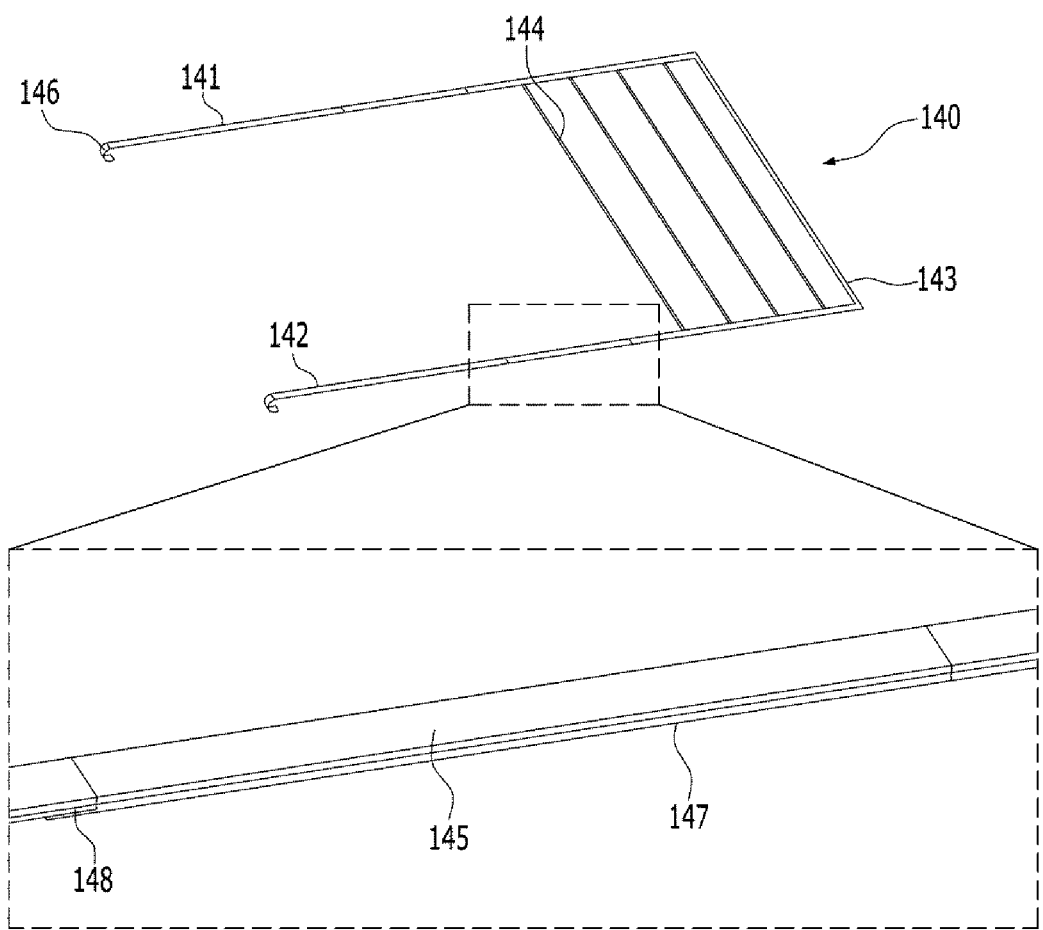
FIG. 6B is a perspective view illustrating the upper case shown in FIG. 4, which is expanded into the expanded mode and a portion of which is illustrated in an enlarged view.
Figure 6C:
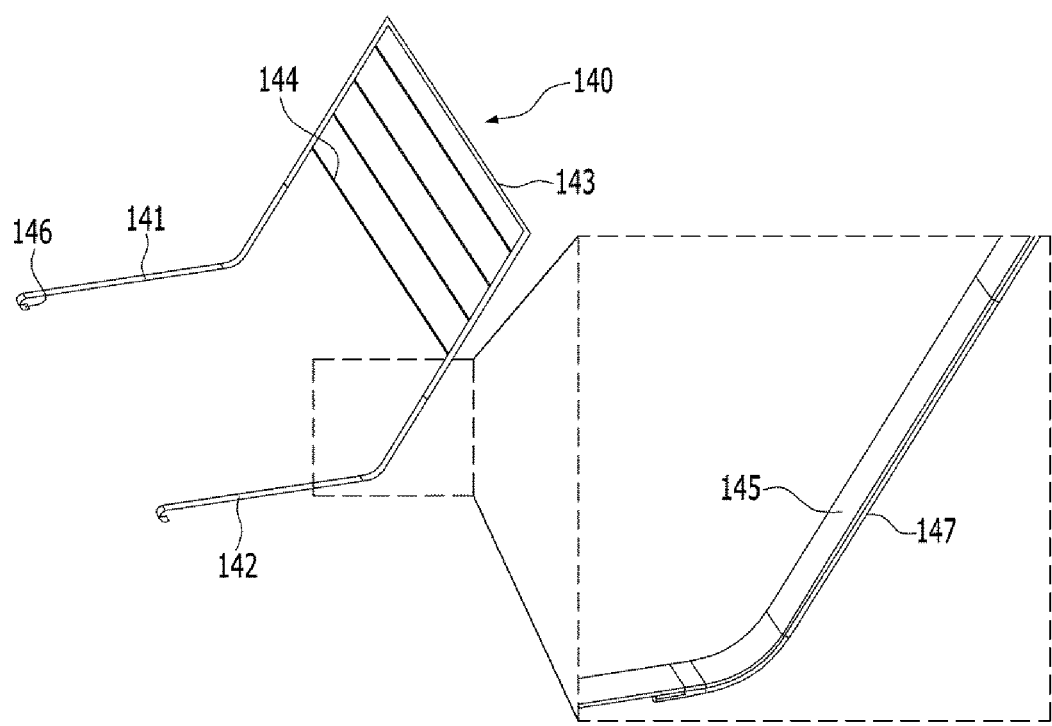
FIG. 6C is a perspective view illustrating the upper case shown in FIG. 4, which is folded into the pivot mode and a portion of which is illustrated in an enlarged view.

FIG. 6A is a perspective view illustrating the upper case 140 of the foldable display device shown in FIG. 4, which is folded into the dual mode and a portion of which is illustrated in an enlarged view. FIG. 6B is a perspective view illustrating the upper case 140 shown in FIG. 4, which is expanded into the expanded mode and a portion of which is illustrated in an enlarged view. FIG. 6C is a perspective view illustrating the upper case 140 shown in FIG. 4, which is folded into the pivot mode and a portion of which is illustrated in an enlarged view.

Referring to FIG. 6A to FIG. 6C, the flexible frame members 145 are positioned at the centers of the first frame member 141 and the second frame member 142. The flexible frame members 145 may be integrally formed with the first frame member 141 and the second frame member 142 through, for example, co-injection molding. The flexible frame member 145 may be made of a soft material such as plastic or silicone so as to be softly bent during a folding procedure.

Each of the flexible frame members 145 is provided on the rear surface thereof with the tension spring 147. The tension spring 147 provides tensile force or compression force in a longitudinal direction so as to maintain the upper case 140 in the folding region 113 in a straightly unfolded state. The tension springs 147 are coupled not only to the rear surfaces of the flexible frame members 145 but also to portions of the first frame member 141 and the second frame member 142. The first frame member 141 and the second frame member 142 are respectively provided on the rear surfaces thereof with coupling members 148 to which the tension springs 147 are coupled. Each of the coupling members 148 may be configured to have an approximate C-shaped cross section so as to surround at least a portion of the outer surface of the tension spring 147, and the tension spring 147 may be fitted into the coupling member 148 in an interference manner, having an interference fit.

Figure 7:
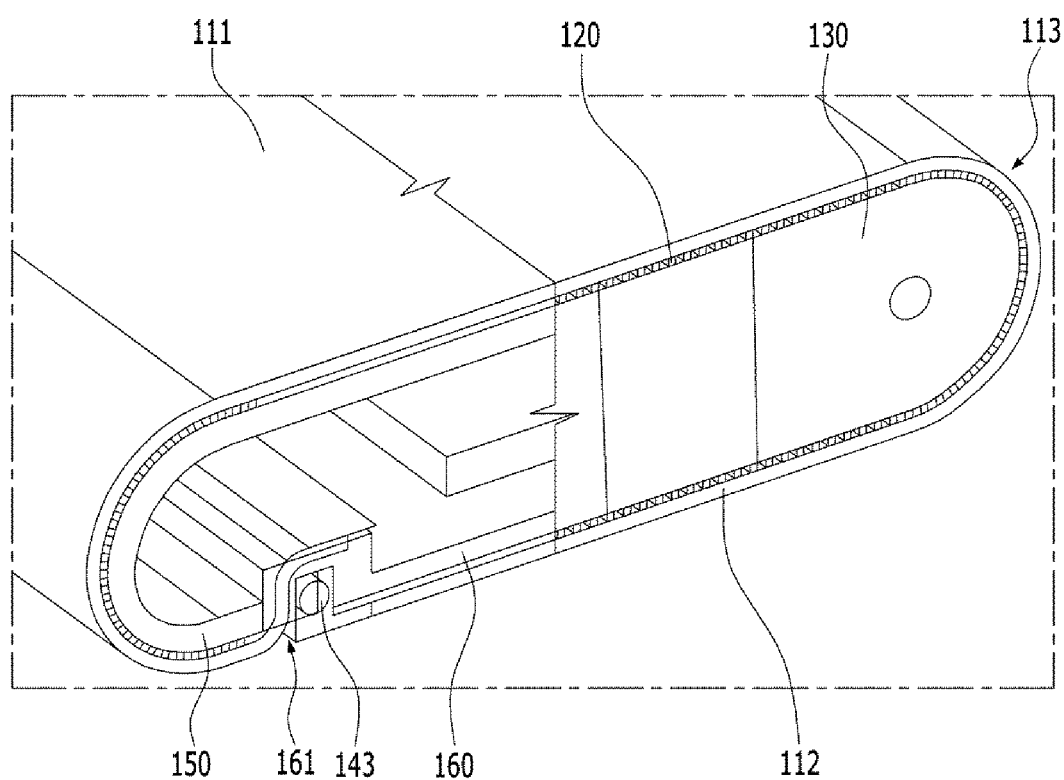
FIG. 7 is a fragmentary cross-sectional view illustrating opposite ends A-A' of the foldable display device shown in FIG. 1 in the dual mode.

FIG. 7 is a fragmentary cross-sectional view illustrating opposite ends A-A' of the foldable display device shown in FIG. 1 in the dual mode.

Referring to FIG. 7, the first display region 111 and the second display region 112 may display images in opposite directions in the dual mode. For example, it is possible to provide children who sit across each other with display of different images appropriate to their ages, or with display of the same image.

The display panel 110 shown in FIG. 7 is provided on the upper side thereof with the first display region 111 and on the lower side thereof with the second display region 112. A first end of the display panel 110 (e.g., the right side as seen from the figure) may be folded at the edge of the hinge part 130, and a second end of the display panel 110 (e.g., the left side as seen from the figure) may also be folded with the same curvature as that of the first end. FIG. 7 illustrates the second end and the first end of the display device with respect to the central thick broken line.

The third frame member 143 is securely fitted into the holding groove 161 in the lower case 160, and the first display region 111 and the second display region 112 are maintained in the state of facing in opposite directions. Although not illustrated in the drawing, in another embodiment, the position at which the third frame member 143 is fitted into the holding groove 161 may be moved to the curved portion of the second end. For example, the holding groove 161 is positioned along the curved portion of second end to provide an extended second display region 112.

Figure 8:
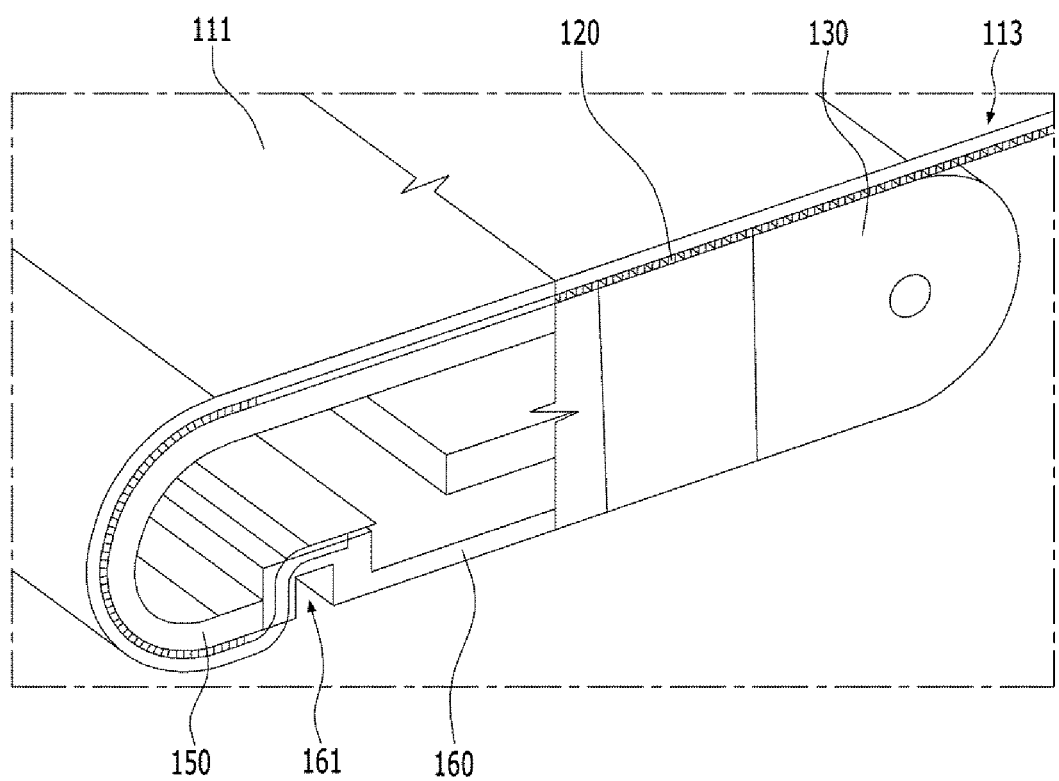
FIG. 8 is a fragmentary cross-sectional view illustrating opposite ends B-B' of the foldable display device shown in FIG. 2 in the expanded mode.

FIG. 8 is a fragmentary cross-sectional view illustrating opposite ends B-B' of the foldable display device shown in FIG. 2 in the expanded mode.

Referring to FIG. 8, the expanded mode may be realized by unfolding the folding region 113 of the display panel 110. When the first display region 111 and the second display region 112 are unfolded in this way, the first display region 111 and the second display region 112 are integrated into a single display region, thereby realizing a large screen capable of displaying a large, single display information (e.g., images, videos, or the like). In other embodiments, the first display region 111 and the second display region 112 is capable of displaying different kinds of display information even under the expanded mode. For example, under the expanded mode, a user can choose to view a movie clip from first display region 111 and concurrently view pictures from an album from the second display region 112.

In one embodiment, when the third frame member 143 is pulled out of the holding groove 161, the second display region 112 may be automatically unfolded into the expanded mode by virtue of the flexible frame member 145 and the tension spring 147. Since only the rear surface of the first display region 111 is provided with the control module 151, the battery 152, the hinge part 130 and the like, the second display region 112 having a small thickness may be more easily unfolded.

In another embodiment, when the third frame member 143 is pulled out of the holding groove 161, the second display region 112 may not automatically be unfolded into the expanded mode. The first display region 111 and the second display region 112 may maintain a pivot mode similar to that shown in FIG. 3 but in an opposite manner. For example, unlike the pivot mode as shown in FIG. 3, the second display region 112 will be positioned closer to the rear surface of the first display region 111 where the control module 151, the battery 152, and other components are located.

Figure 9:
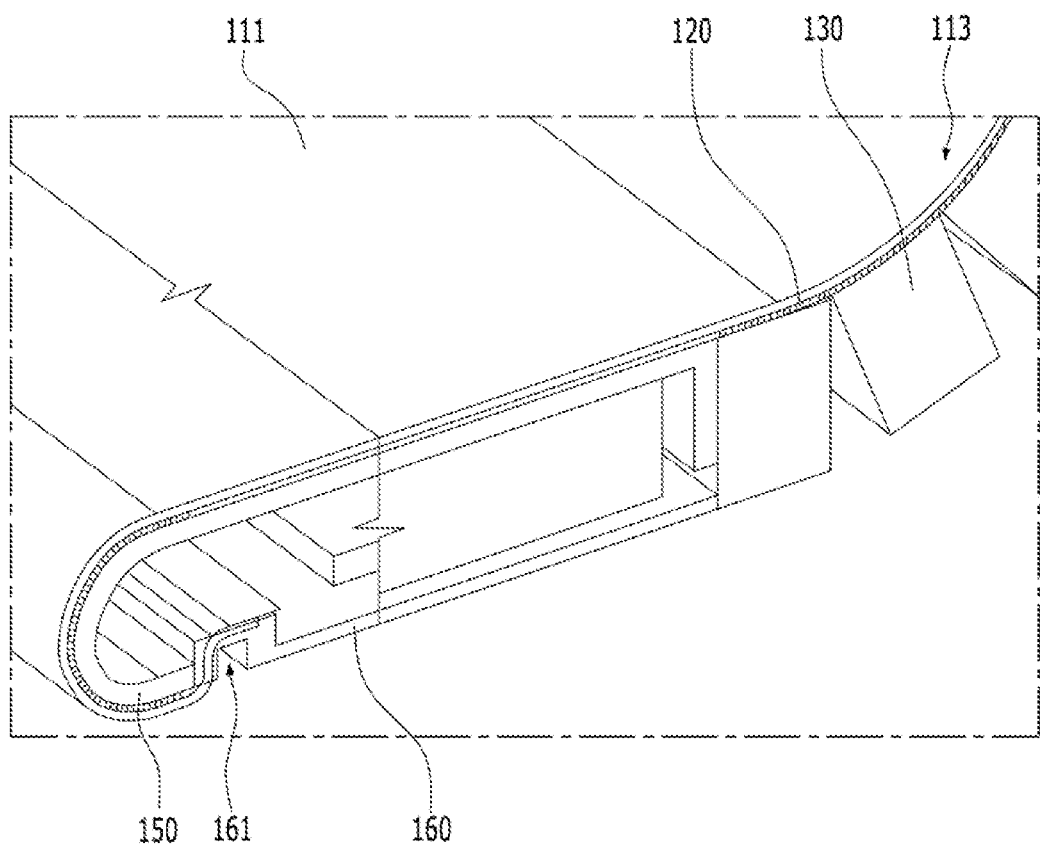
FIG. 9 is a fragmentary cross-sectional view illustrating the left end and the right folding region C-C' of the foldable display device shown in FIG. 3 in the pivot mode.

FIG. 9 is a fragmentary cross-sectional view illustrating the left end and the right folding region C-C' of the foldable display device shown in FIG. 3 in the pivot mode.

Referring to FIG. 9, the hinge part 130 that corresponds to the folding region 113 is folded.

In one embodiment, the second display region 112 of the display panel 110 is folded along the end of the hinge part 130 and is maintained on the rear surface of the lower case 160 in the dual mode (e.g., outer folding type). In another embodiment, in the pivot mode of the display panel 110, the plurality of hinge parts 130 in the folding region 113 becomes spaced apart from each other to transition the display from a dual mode to a pivot mode. In further embodiments, although not illustrated in the drawings, the hinge part 130 may, of course, be completely folded into the inner folding type.

As is apparent from the above description, the foldable display device according to the present disclosure has the following exemplary effects and is not limited to those listed herein.

First, the foldable display device 100 may be selectively folded into the dual mode, the expanded mode and the pivot mode. It may further be folded into other suitable angles to best provide user experience using the display device.

Second, the second display region 112 may be unfolded about the folding region 113, thereby allowing easy conversion of the dual mode into the expanded mode.

Third, since only the rear surface of the first display region 111 is provided with bulk components such as the control module 151, the battery 152 and the hinge part 130, the volume and thickness of the display device 100 are not increased.

Fourth, since the support members 144 are disposed on the rear surface of the second display region 112, it is possible to prevent the second display region 112 from being easily deformed or the display panel 110 from being folded in the opposite direction due to external force, which may be applied by a user upon touching the display panel 110.

Figure 10:
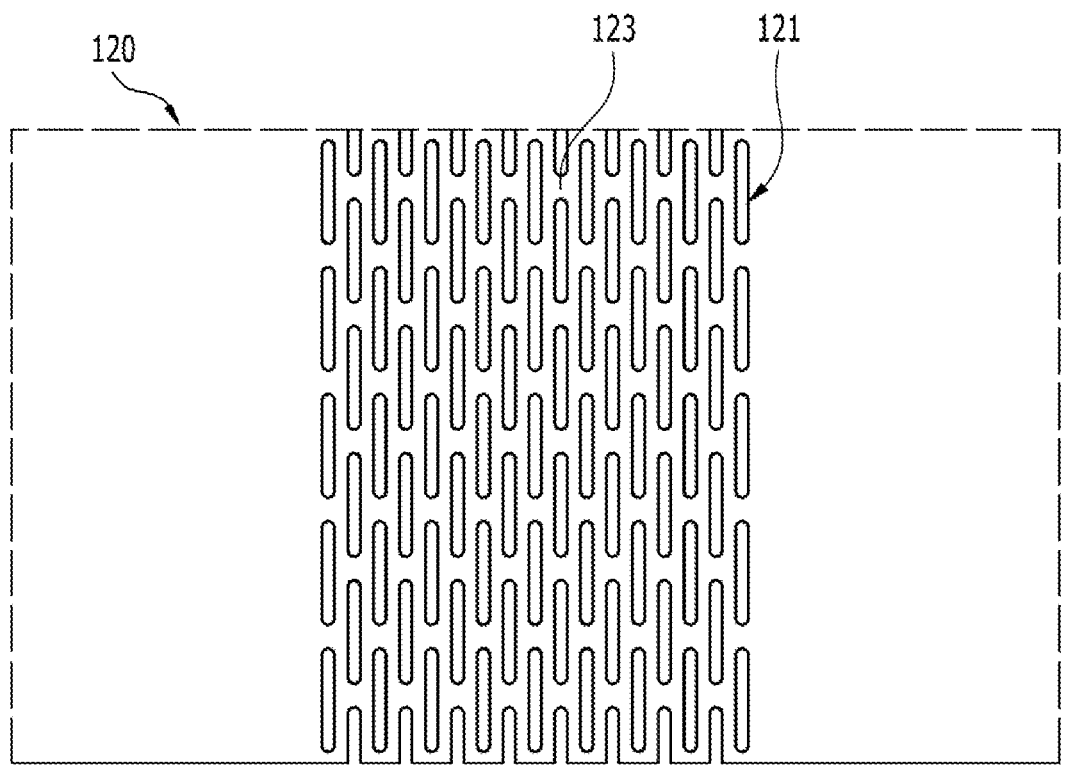
FIG. 10 is a top view illustrating area D of a mid-frame of the foldable display device shown in FIG. 4 according to one embodiment of the present disclosure.

FIG. 10 is a top view illustrating area D of a mid-frame 120 of the foldable display device 100 shown in FIG. 4 according to one embodiment of the present disclosure. The mid-frame 120 which in one embodiment is a thin flat metal plate is provided with a plurality of holes 121 in a folding region of the mid-frame 120. The location of the plurality of holes 121 overlaps with the corresponding location of the hinge part 130 such that both parts fold according to the various display modes (e.g., dual mode, pivot mode, and expanded mode) of the foldable display device 100.

The mid-frame 120 includes a connecting member 123 between the plurality of holes 121. In one embodiment, the connecting members 123 are residual portions of the mid-frame 120. After the plurality of holes 121 are, for example, punched and formed extending through the mid-frame 120, the locations where the holes are not formed results in the connecting members 123. In another embodiment, the connecting members 123 are separate member that is capable of holding the plurality of holes 121 together with the rest of the part of the mid-frame 120. The connecting members 123 may have elasticity to be stretched during the dual mode or the pivot mode. In addition, the connecting members 123 may contract or shrink to be used during the expanded mode. The voids formed by the plurality of holes 121 also provide space during the change of modes. For example, when the display device 100 is folded to be used in a dual mode, the holes 121 and the connecting members 123 between the holes 121 may be stretched and the size of both the holes 121 and the connecting members 123 may be expanded or enlarged. On the contrary, when the display device 100 is completely unfolded to be used in an expanded mode, the holes 121 and the connecting members 123 between the holes 121 may be contracted and the size of both the holes 121 and the connecting members 123 may be decreased. In this process, the void or space formed by the holes 121 are extended or shrunk based on the modes of the display which provides additional elasticity and expandability to the mid-frame 120.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A folding display device, comprising:
a flexible display panel that is configured to be folded, the flexible display panel including a first display region and a second display region;
a first case positioned at a periphery of the flexible display panel, the first case extending along the first and second display regions, the first case including a frame structure having a first frame member, a second frame member, a third frame member, and hook frame members, the hook frame members at each end of the first frame member and the second frame member, the hook frame members having inner curved surfaces;
a mid-frame positioned adjacent to the flexible display panel to support the flexible display panel, the mid-frame extending across the first and second display regions, wherein one end of the mid-frame is bent along the inner curved surfaces of the hook frame members;
a plurality of holes extending through the mid-frame at a folding region of the mid-frame;
a second case positioned adjacent to the mid-frame to support the mid-frame, the second case extending across the first display region, the second case having a hinge part overlapping the plurality of holes in the mid-frame, wherein the hinge part is coupled to one end of the second case and the one end of the second case facing another end of the second case is curved along the inner curved surfaces of the hook frame members; and
a third case positioned adjacent to the second case and configured to support the second case.

2. The folding display device of claim 1, wherein the hinge part includes a plurality of unit hinges that are connected to each other, the plurality of unit hinges capable of being folded in sequences based on the configuration of the flexible display panel.

3. The folding display device of claim 2, wherein the plurality of unit hinges is capable of forming a selected curvature based on the folded sequences.

4. The folding display device of claim 3, wherein the first frame member and the second frame member each have a flexible frame member adjacent to a folding region of the first frame member and the second frame member, the flexible frame member capable of being folded based on the selected curvature of the plurality of unit hinges.

5. The folding display device of claim 4, wherein the flexible frame member divides the flexible display panel to the first display region and the second display region.

6. The folding display device of claim 5, wherein the flexible frame member overlaps with a location of the hinge part.

7. The folding display device of claim 6, wherein the folding display device has one or more display modes including an expanded mode, a dual mode, and a pivot mode,
wherein the expanded mode displays the flexible display panel at an unfolded state,
wherein the dual mode displays the flexible display panel at a fully folded state, the fully folded state including a state where the first case and the second case is interlocked with each other, and
wherein the pivot mode displays the flexible display panel at any folded state, the any folded state including any state between the unfolded state and the fully folded state.

8. The folding display device of claim 7, wherein the expanded mode displays the first display region and the second display region as a combined single display.

9. The folding display device of claim 7, wherein the dual mode displays first display information at the first display region and second display information at the second display region.

10. The folding display device of claim 9, wherein the first display information and the second display information is a same data.

11. The folding display device of claim 9, wherein the first display information and the second display information is a different data.

12. The folding display device of claim 7, wherein the pivot mode includes an outer folding type and an inner folding type,
wherein the outer folding type forms the selected curvature to have an obtuse angle; and
wherein the inner folding type forms the selected curvature to have an acute angle.

13. The folding display device of claim 7, wherein the frame structure further comprising support members between the flexible frame member and the third frame member, wherein the support members overlap with the second display region.

14. The folding display device of claim 13, wherein each of the support members are spaced apart from each other.

15. The folding display device of claim 14, wherein the third case has fitting holes to fit the support members.

16. The folding display device of claim 13, further comprising:
a tension spring on the flexible frame member; and
a coupling member, the tension spring being coupled to a surface of the flexible frame member through the coupling member.

17. The folding display device of claim 16, wherein the coupling member has a C-shaped cross section to cover a portion of the tension spring.

18. The folding display device of claim 15, wherein the third case includes a holding groove.

19. The folding display device of claim 18, wherein the holding groove interlocks the third frame member to the third case during the dual mode.

20. A folding display device, comprising:
a flexible display panel that is configured to be folded, the flexible display panel including a first display region and a second display region;
a first case positioned at a periphery of the flexible display panel, the first case extending along the first and second display regions, the first case including a frame structure having a first frame member, a second frame member, a third frame member between the first frame member and the second frame member, and hook frame members, the hook frame members at each end of the first frame member and the second frame member, the hook frame members having inner curved surfaces;
a mid-frame positioned adjacent to a rear surface of the flexible display panel to support the flexible display panel, the mid-frame extending across the first and second display regions, the mid-frame having a plurality of holes extending through the mid-frame at a folding region, wherein one end of the mid-frame is bent along the inner curved surfaces of the hook frame members; and
a second case positioned adjacent to the mid-frame extending co-planar with the mid-frame to support the mid-frame, the second case extending across the first display region, the second case having a hinge part overlapping the plurality of holes in the mid-frame, wherein the hinge part is coupled to one end of the second case and another end of the second case is curved along the inner curved surfaces of the hook frame members, wherein the another end of the second case faces the one end of the second case,
wherein the folding display device has one or more display modes including an expanded mode, a dual mode, and a pivot mode,
wherein the expanded mode displays the flexible display panel at an unfolded state,
wherein the dual mode displays the flexible display panel at a fully folded state, the fully folded state including a state where the first case and the second case is interlocked with each other, and
wherein the pivot mode displays the flexible display panel at any folded state, the any folded state including any state between the unfolded state and the fully folded state.

* * * * *